(12) United States Patent
Kubo

(10) Patent No.: US 6,576,955 B2
(45) Date of Patent: Jun. 10, 2003

(54) INSULATED GATE FIELD EFFECT SEMICONDUCTOR DEVICE

(75) Inventor: Hirotoshi Kubo, Gunma (JP)

(73) Assignee: Sanyo Electric Co., Ltd., Moriguchi (JP)

(*) Notice: Subject to any disclaimer, the term of this patent is extended or adjusted under 35 U.S.C. 154(b) by 0 days.

(21) Appl. No.: 09/917,239

(22) Filed: Jul. 30, 2001

(65) Prior Publication Data

US 2002/0043684 A1 Apr. 18, 2002

(30) Foreign Application Priority Data

Aug. 3, 2000 (JP) .................................... 2000-236024

(51) Int. Cl.[7] ............................................... H01L 29/76
(52) U.S. Cl. ..................................... 257/332; 257/331
(58) Field of Search ................................. 257/330, 331, 257/332, 341

(56) References Cited

U.S. PATENT DOCUMENTS 5,410,170 A * 4/1995 Bulucea et al. ............. 257/332
5,970,344 A 10/1999 Kubo et al.
5,972,741 A 10/1999 Kubo et al.
6,060,747 A * 5/2000 Okumura et al. ........... 257/331

FOREIGN PATENT DOCUMENTS

| JP | 2997247 | 10/1999 |
| JP | 2001-102576 | 4/2001 |
| JP | 2001-119023 | 4/2001 |

* cited by examiner

Primary Examiner—Douglas A. Wille
(74) Attorney, Agent, or Firm—Morrison & Foerster LLP

(57) ABSTRACT

The present invention is intended to form the adjacent trenches by bending them to make a widened portion and a narrowed portion on the substrate of the semiconductor inside the trenches shaped in stripes and to arrange the adjacent widened portions and the narrowed portions alternately to lay the body contact region in the widened portion. By this arrangement, the stability of the potential is improved and thus leakage current is decreased. Further, the on-state resistance can be decreased and an advantage in rule is achieved while improving the channel width per unit area.

9 Claims, 3 Drawing Sheets

PRIOR ART

INSULATED GATE FIELD EFFECT SEMICONDUCTOR DEVICE

FIELD OF THE INVENTION

The present invention relates to an insulated gate field effect semiconductor device, and more particularly, to an insulated gate field effect semiconductor device that reduces the on-state resistance to improve the stability of the potential of the substrate thereby reducing the leakage current between drain and source regions.

BACKGROUND OF THE INVENTION

With the widespread use of mobile terminals, requirements for small-size, large-capacity lithium-ion batteries have increased. The protection circuit to implement battery management for charging and discharging lithium-ion batteries must be small in size and strong enough to withstand possible short circuit of load to meet the need of light-weight design of mobile terminals. Such protection circuit needs to be mounted in the container of the lithium-ion battery; therefore, small-size design is expected and the COB (Chip On Board) technology using many chips has been employed to meet small-size requirements.

On the other hand, however, power MOSFET's are connected in series with the lithium-ion battery; therefore, there is a need for minimizing the on-state resistance of the power MOSFET. This is an indispensable ingredient for elongating the calling period or standby period in the mobile telephone applications. In order to reduce the on-state resistance, it is necessary to get more current paths. For that purpose, high integration of cells by reducing the cell pitch through the use of micro-fabrication technology and widening the channel width per unit area are expected as major technologies.

FIG. 4 and FIG. 5 show a top view of a trench type power MOSFET based on conventional wiring pattern.

In FIG. 4, a top view of a MOSFET with trenches 27 formed in lattice structure is shown. The trench type MOSFET is composed of lattice type trenches 27, the gate electrode 32 which is embedded inside the trench 27, the source region 33 which is provided along the trench 27, and the body contact region 35 which is provided in the region surrounded by the source region 33. Here, interlayer insulating film and source electrode are omitted.

The portion given in broken line is the cell 38, one of the cells of trench type MOSFET.

The trench 27 is about 1 μm in width and is formed in lattice structure spaced at about 5 μm on the actual operating region and the inside wall is covered with a gate oxide layer (not shown).

The gate electrode 32 is designed to have a low resistance by introducing an impurity while embedding polysilicon inside the trench 27.

The source region 33 is provided along the trench 27 and is formed in the shape of square or the equivalent shape. This allows the width of channel region per unit area (channel width) which may become a current path to be increased and thus the on-state resistance to be reduced.

The body contact region 35 is formed in island configuration surrounded by source region 33 in the shape of square with sides of about 2 μm or in the equivalent shape for the stabilization of the potential of the substrate.

The channel region (not shown) is formed in the direction from the source region 33 to the depth of the trench 27 and adjacent to the gate electrode 32 with a gate oxide layer (not shown) between them.

FIG. 5 shows a top view of the MOSFET that has trenches 27 formed in stripes. Since the trenches 27 are formed in stripes spaced at about 5 μm and the source regions 33 provided along trenches 27 also take the form of stripes, the source regions 33 are continuous among a plurality of cells 38. The body contact region 35 is formed like an island at about the center portion of the source region 33 and adjacent to the source region 33.

Accordingly, even if the body contact region 35 is poor in contact in one cell 38, the potential of the substrate is kept stable because the channel region (not shown) is continuous unlike the lattice structure.

In FIG. 6, the structure of the power MOSFET of conventional trench structure is shown taking an N-channel type as an example.

The drain region 22 consisting of the N⁻-type epitaxial layer on the N⁺-type silicon semiconductor substrate 21 and the channel layer 24 of P type on the surface of the region. The trench 27 through the channel layer 24 and reaches the drain region 22 is provided and the gate electrode 32 that is comprised of the inside wall of a trench 27 covered with a gate oxide layer 28 and polysilicon filling trench 27 is provided.

On the surface of the channel layer 24 adjacent to the trench 27 is formed the N⁺-type source region 33 and on the surface of the channel layer 24 between the source regions 33 of two adjacent cells 38 is provided the P⁺-type body contact region 35. In addition, on the channel layer 24 is formed the channel region 34 along the source region 33 through the trench 27.

The gate electrode 32 is covered with the interlayer insulator 36 and the source electrode 37 to contact the source region 33 and the body contact region 35 is provided.

A conventional trench has the following problems in its shape.

First, with the pattern configuring trench in lattice structure, a cell 38 is surrounded by some trenches 27 like an island and the body contact region 35 is formed in a minute area to attain highly integrated configuration. Accordingly, silicon nodule that is mixed when sputtering source electrode 37 may block the body contact region 35 and the electric charge of the channel region 34 induced by the gate electrode 32 may lose its escape way.

In other words, the potential of the channel region 34 fluctuates in a single cell 38 in island, showing the same state as that a voltage is always being applied by the gate electrode 32, and thereby results in the state the channel is open. As a result, current leaks from the cell and may be considered as the cause of leakage current between the drain and source regions.

On the other hand, with the pattern of forming the trenches 27 in stripes, even if the body contact region 35 becomes poor in contact in a single cell 38, the channel region 34 is continuous among a plurality of cells 38. Therefore, without being affected by the silicon nodule, the potential of the substrate is kept more stable than the case with the trench 27 formed in lattice structure. As a result, it is considered that no leakage current may occur between the drain and source regions.

With the pattern formed in stripes, however, as the spacing between trenches 27 is designed to meet the size (about 2 μm in width) of body contact region 35, the number of channel regions 34 per unit area may not be increased as compared with the trench in lattice structure. Accordingly, the on-state resistance is less advantageous than the case with a form of lattice structure and is not suited for low on-state resistance implementation.

SUMMARY OF THE INVENTION

The present invention is made for solving the above-mentioned problems of conventional techniques. An object of the invention is to provide the method of improving the stability of potential in the substrate even when poor contact is present in the body contact region, thus preventing leakage current and attaining the low on-state resistance implementation.

In order to attain the above object, according to the first aspect of this invention, there is provided an insulated gate field effect semiconductor device having, a semiconductor substrate with a drain region formed in it and a plurality of trenches provided on a surface of the substrate. Trenches are formed as stripes aligning in a direction. The device also has a gate electrode embedded inside the trench, a gate insulating film provided on an inside wall of the trench for covering the gate electrode, and a source region provided on the substrate surface adjacent to the trench. In this configuration, the strips of the trench are deformed so that a portion of the surface of the substrate defined by two adjacent stripes has a wide portion and a narrow portion, and a body contact region is formed on the wide portion According to the second aspect of this invention, the device has a plurality of cells defined by the stripes of the trenches, and the cells correspond to the wide portion having the body contact portion on its surface.

According to the third aspect of this invention, the source region is provided within the cell excluding the area for the body contact.

According to the fourth aspect of this invention, the narrow portion is narrower than the size of the body contact region.

According to the fifth aspect of this invention, the narrow portions and the wide portions alternate in the direction of the stripe alignment.

According to the sixth aspect of this invention, only the source region is provided on the surface of the semiconductor substrate in the narrow portion.

DETAILED DESCRIPTION OF THE INVENTION

Now referring to FIG. 1 through FIG. 3, preferred embodiments of the invention are described below.

Figure 1:
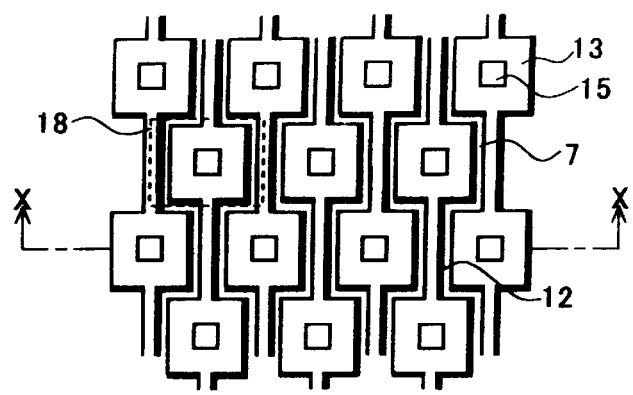
FIG. 1 shows a top view of an insulated gate field effect semiconductor device of this invention.

FIG. 1 shows a top view of a trench type power MOSFET.

The trench type MOSFET has a plurality of trenches 7 that are bent to be in deformed stripes provided on the surface of semiconductor substrate to become a drain region, a gate electrode 12 embedded inside the trench 7, a source region 13 provided on the surface of the substrate while adjoining the trench 7, and a body contact region 15 provided adjacent to the source region 13.

Here, interlayer isolator and source electrode are omitted.

The portion shown in broken lines is a single cell 18 of the trench type MOSFET.

The trench 7 is about 1 $\mu$m in width and a plurality of trenches 7 are formed in stripes on the surface of the semiconductor substrate. Here, etching of the trench 7 is implemented by partially bending the etching pattern of the trench provided on the surface of the semiconductor substrate in deformed stripes. This allows a widened portion and a narrowed portion to be formed on the surface of the substrate sandwiched between adjacent trenches 7. For example, the narrowed portion is about 1 $\mu$m that is narrower than the body contact region 15 and the widened portion is about 6 $\mu$m by bending it to be wider in width than the body contact region 15. In addition, the narrowed portions and the widened portions adjacent to each other are arranged alternately.

The gate electrode 12 is designed for low resistance implementation by embedding polysilicon inside the trench 7 and introducing an impurity into it.

The source region 13 is provided on the surface of the semiconductor substrate adjacent to the trench 7. As the source region 13 is provided along the shape of the trench 7 in bent, deformed stripes, it is continuous through a plurality of cells. In addition, since only source region 13 is provided in the narrowed portion, the length of the peripheral of the source region 13 per unit area will become longer than conventional pattern of lattice structure. In other words, the width of the channel region (channel width) per unit area to become a current path can be increased, thereby reducing the on-state resistance.

The body contact region 15 is a widened portion of the trench 7 folded to achieve stable potential of the substrate and is formed in the shape of square about 2 $\mu$m each side or the similar shape adjacent to the source region 13.

Figure 2:
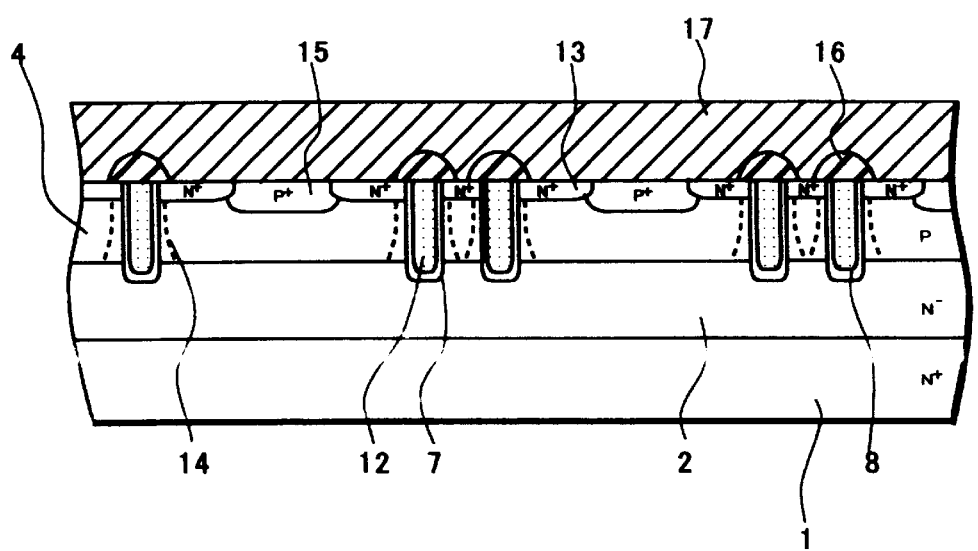
FIG. 2 shows a sectional view of an insulated gate field effect semiconductor device of this invention.

FIG. 2 shows the sectional structure of the trench type power MOSFET of this invention taking N-channel type as an example. This sectional view corresponds to the section X—X in FIG. 1.

The trench type power MOSFET has a one conductivity type semiconductor substrate to consist a drain region 2, a opposite conductivity type channel layer 4 provided on the surface of semiconductor substrate, a trench 7 reaching a drain region 2 through a channel layer 4, a gate oxide layer 8 provided on the inside wall of a trench 7, a gate electrode 12 embedded inside a trench 7, a one conductivity type source region 13 provided adjacent to the trench 7 on the surface of the channel layer 4, and a opposite conductivity type body contact region 15 provided between adjacent source regions 13.

The semiconductor substrate consists of a drain region 2 where an $N^-$-type epitaxial layer is laid on the $N^+$-type silicon semiconductor substrate 1.

The channel layer 4 is provided by implanting P-type ion on the surface of the semiconductor substrate.

The trench 7 reaches the drain region 2 through the channel layer 4. The trench 7 is in the shape of deformed stripes and bent so that adjacent trenches 7 form a widened portion and a narrowed portion on the surface of the semiconductor substrate. On the surface of the channel layer 4 of the widened portion is provided a source region 13 adjacent to the trench 7, and a body contact region 15 is provided adjacent to the source region 13. On the surface of the channel layer 4 of the narrowed portion is provided only a source region 13. A source electrode 17 contacts the narrow source region 13 between two adjacent trenches 17 as well as the wide source region adjacent the body contact region 17, as shown in FIG. 2. In addition, the widened portions and narrowed portions adjacent to each other are arranged alternately.

The gate oxide layer 8 is formed in a thickness of several hundreds Å according to the drive voltage by thermally oxidizing the inside wall of the trench 7.

The gate electrode 12 is formed by embedding polysilicon inside the trench 7 and implanting an impurity therein to attain low resistance implementation.

The source region 13 is provided by implanting $N^+$ type ion in the surface of the channel layer 4 adjacent to the trench 7. Also the source region 13 is formed along the trench 7 in bent, deformed stripe shape; therefore, it is continuous through a plurality of cells 18 and, owing to the source region 13 of the narrowed portion, the length of the peripheral of the source region 13 per unit area is improved as compared with a conventional pattern.

Increase in the length of the peripheral of the source region 13 may result in the increase in the width of the channel or current path.

The channel region 14 is formed adjacent to the gate electrode 12 via the gate oxide layer 8 in the direction of depth of the trench 7 from the source region 13. As the channel region 14 is formed along the source region 13, it is continuous through a plurality of cells 18 and, even if the body contact region 15 is poor in contact in a single cell 18, the potential of the channel region 14 does not fluctuate, thus preventing leakage current between the drain and source regions.

The body contact region 15 is formed to have a width of about 2 $\mu$m by implanting $P^+$ type ion between adjacent source regions 13 on the surface of the channel layer 4 of the widened portion provided by the trench 7 and used for stabilizing the potential of the substrate.

The interlayer oxide layer 16 is formed by depositing an oxide layer to cover at least the gate electrode 12.

The source electrode 17 is formed by sputtering a metal film such as Al—Si, etc. on all surfaces.

The characteristic of this invention lies in the forming of the trench 7 by bending the pattern of trench etching of the surface of the semiconductor substrate to be in deformed stripes. Accordingly, on the surface of the substrate sandwiched between adjacent trenches 7 are provided the widened portions and the narrowed portions. The adjacent widened portions and the narrowed portions are arranged alternately, and in the widened portion are formed the source region 13 and the body contact region 15 and in the narrowed portion is formed only the source region 13.

By this, in the first, the distance between adjacent trenches 7 in the narrowed portion can be reduced to about 1 $\mu$m and thus the number of trenches 7 can be increased. As a result, the length of the peripheral of the source region 13 per unit area is improved as compared with a conventional pattern, thereby increasing the width of the channel or current path.

In concrete, the area of a conventional cell is 25 $\mu m^2$ for both lattice and stripe types and the trench width is 1 $\mu$m and the channel width is 16 $\mu$m for lattice type and 10 $\mu$m for stripe type; therefore, the channel width per unit area is 0.64 (16/25) $\mu$m for lattice type and 0.4 (10/25) $\mu$m for conventional stripe type. In the embodiment of this invention, the interval between the trenches of the adjacent narrowed portion is 1 $\mu$m, cell area 30 $\mu m^2$, trench width 1 $\mu$m, and channel width 24 $\mu$m; therefore, the channel width per unit area is 0.8 (24/30) $\mu$m.

Accordingly, in the embodiment of this invention, the channel width per unit area will increase 25% as compared with the lattice pattern that is advantageous in the on-state resistance. Since the on-state resistance decreases in proportion to the channel width per unit area, the on-state resistance may be decreased by 25%.

Secondly, because of bent, deformed stripe type, the source region 13 and the channel region 14 are continuous through a plurality of cells 18 and even if the body contact region 15 in one cell 18 is blocked by silicone nodule, etc., the potential of the channel region 14 of the cell 18 does not fluctuate, thereby preventing leakage current between the drain and source regions.

Thirdly, improvement of the channel width per unit area may be advantageous in rule.

Figure 3:
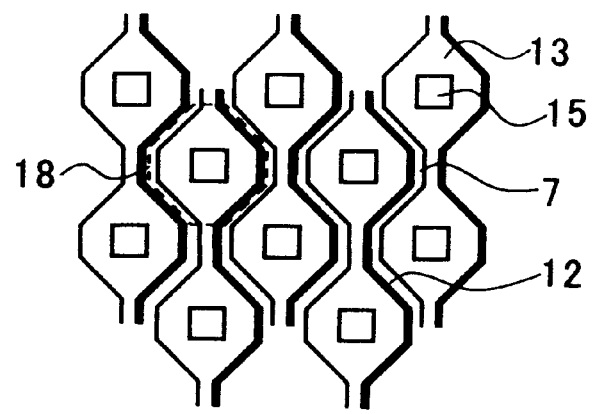
FIG. 3 shows a top view of an insulated gate field effect semiconductor device of this invention.
Figure 4:
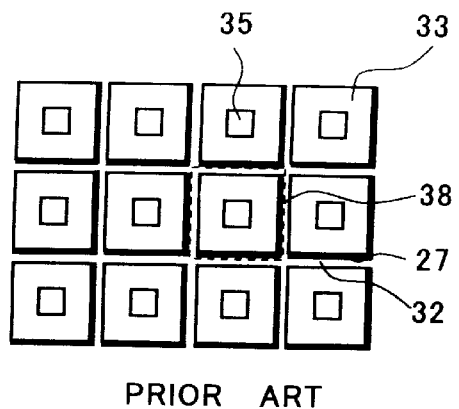
FIG. 4 shows a top view of a conventional insulated gate field effect semiconductor device.
Figure 5:
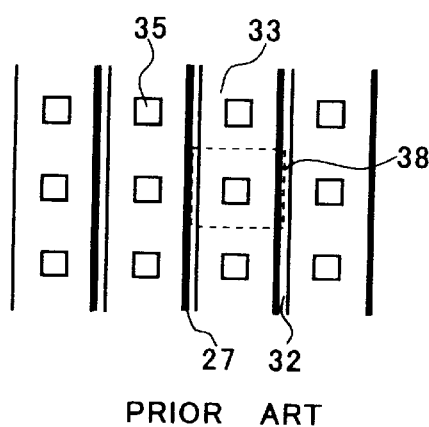
FIG. 5 shows a top view of a conventional insulated gate field effect semiconductor device.
Figure 6:
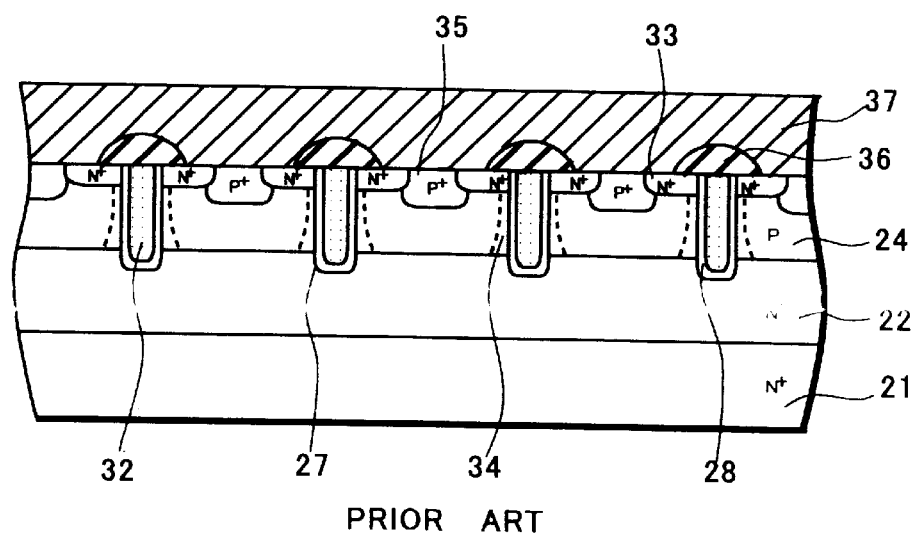
FIG. 6 shows a sectional view of a conventional insulated gate field effect semiconductor device.

Also, although the cell in the embodiment of this invention was explained in the description of quadrangle, the equivalent effect may be obtained even if the trench 7 is bent so that a polygon with more than four sides is formed around the body contact region 15 as shown in FIG. 3.

According to this invention, first of all, by providing a widened portion and a narrowed portion by bending trench 7, source region 13 and body contact region 15 are formed in the widened portion, and only source region 13 can be formed in the narrowed portion. In other words, the interval between adjacent trenches 7 can be greatly narrowed in the narrowed portion as compared with conventional one, thereby increasing the number of trenches 7.

As a result, in comparison with conventional pattern, the channel width per unit area increases and thus on-state resistance may be decreased. In concrete, in comparison with the conventional lattice pattern that was advantageous in on-state resistance, the channel width per unit area increases 25% and thus the on-state resistance is greatly reduced by 25%.

Secondly, since the source region 13 and the channel region 14 are in bent, deformed stripe shape, they are continuous through a plurality of cells 18 and, even if the body contact region 15 is blocked by silicon nodule in one cell 18, the potential of the channel region 14 of the cell 18 does not fluctuate and thus the stability of the substrate potential may be improved, thereby preventing leakage current between the drain and source regions.

Thirdly, the improvement of channel width per unit area may be advantageous in rule.

Accordingly, with the stability of the substrate potential and the implementation of the low on-state resistance taken into consideration, an insulated gate field effect semiconductor device that is advantageous in rule even by improving the channel width per unit area can be presented.

What is claimed is:

1. An insulated gate field effect semiconductor device, comprising:
   a semiconductor substrate having a drain region therein;
   a plurality of trenches provided on a surface of the substrate, said trenches being aligned as stripes in a direction;
   a gate electrode embedded inside the trench;
   a gate insulating film provided on an inside wall of the trench for covering the gate electrode;

a source region provided on the substrate surface adjacent to the trench; and a source electrode connected to the source region, wherein the stripes of the trench are deformed such that a portion of the surface of the substrate defined by two adjacent stripes has a portion and a narrow portion, and a body contact region is disposed on the wide portion, the source electrode contacting the wide portion and the narrow portion.

2. An insulated gate field effect semiconductor device according to claim 1, wherein the narrow portion is narrower than the body contact region.

3. An insulated gate field effect semiconductor device according to claim 1, wherein the wide and narrow portions alternate in the direction of the stripe alignment.

4. An insulated gate field effect semiconductor device according to claim 1, wherein the narrow portion has the source region and does not have the body contact region.

5. An insulated gate field effect semiconductor device having a plurality of cells comprising:

a semiconductor substrate having a drain region therein;

a plurality of trenches provided on a surface of the substrate, said trenches being aligned as stripes in a direction and defining the cells;

a gate electrode embedded inside the trench;

a gate insulating film provided on an inside wall of the trench for covering the gate electrode;

a source region provided on the substrate surface adjacent to the trench; and a source electrode connected to the source region, wherein the strips of the trench are deformed such that a portion of the surface of the substrate defined by two adjacent stripes has a wide portion and a narrow portion, and a body contact region is disposed on the wide portion, said wide portion corresponding to the cell, the source electrode contacting the wide portion and the narrow portion.

6. An insulated gate field effect semiconductor device according to claim 5, wherein the source region is provided within the cell surrounding the body contact region.

7. An insulated gate field effect semiconductor device according to claim 5, wherein the narrow portion is narrower than the body contact region.

8. An insulated gate field effect semiconductor device according to claim 5, wherein the wide and narrow portions alternate in the direction of the stripe alignment.

9. An insulated gate field effect semiconductor device according to claim 5, wherein the narrow portion has the source region and does not have the body contact region.

* * * * *